United States Patent
Stillabower et al.

(10) Patent No.: US 6,790,102 B2
(45) Date of Patent: Sep. 14, 2004

(54) TWISTED FLAT ELECTRICAL TERMINAL

(75) Inventors: Morris D Stillabower, Tipton, IN (US); Roy A. Visser, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 23 days.

(21) Appl. No.: 10/268,327

(22) Filed: Oct. 10, 2002

(65) Prior Publication Data

US 2004/0072453 A1 Apr. 15, 2004

(51) Int. Cl.⁷ .......................... H01R 11/22; H01R 13/11
(52) U.S. Cl. ...................................... 439/856; 439/876
(58) Field of Search .................................. 439/856, 876

(56) References Cited

U.S. PATENT DOCUMENTS

| | | | |
|---|---|---|---|
| 3,731,261 A | | 5/1973 | Spadoni, Jr. ............... 339/220 |
| 4,596,439 A | * | 6/1986 | Ruehl et al. ............... 439/786 |
| 4,728,305 A | * | 3/1988 | Seidler ...................... 439/876 |
| 5,030,144 A | * | 7/1991 | Seidler ...................... 439/876 |
| 5,112,233 A | * | 5/1992 | Lybrand ..................... 439/79 |
| 5,441,429 A | | 8/1995 | Seidler ...................... 439/876 |
| 5,772,464 A | * | 6/1998 | Hohorst ..................... 439/395 |
| 6,171,116 B1 | | 1/2001 | Wicks et al. ................. 439/79 |
| 6,220,876 B1 | | 4/2001 | Avila et al. ............... 439/76.2 |
| 6,247,965 B1 | | 6/2001 | Cummings et al. ......... 439/587 |
| 6,280,241 B2 | | 8/2001 | Herlinger et al. ........... 439/496 |
| 6,295,726 B1 | * | 10/2001 | Maatta ....................... 29/827 |

FOREIGN PATENT DOCUMENTS

EP          571156 A2  * 11/1993  ............ H01R/9/07

* cited by examiner

Primary Examiner—Hae Moon Hyeon
(74) Attorney, Agent, or Firm—Jimmy L. Funke; Stefan V. Chmielewski

(57) ABSTRACT

A flat twisted electrical terminal is provided for connecting a first circuit element to a second circuit element on respective first and second circuit boards. The terminal includes a flat conductive member having a first end for connecting to a first circuit element and a second end for connecting to a second circuit element. The conductive member is axially twisted about its longitudinal axis.

20 Claims, 2 Drawing Sheets

TWISTED FLAT ELECTRICAL TERMINAL

TECHNICAL FIELD

The present invention generally relates to electrical connections between electrical circuit components and, more particularly, relates to a flat electrical terminal for connecting first and second circuit elements.

BACKGROUND OF THE INVENTION

It is generally common, particularly in the automotive industry, to employ flat leaded terminals (pins) for connecting electrical circuitry in dual in-line packages (DIP), single in-line packages (SIP), and flat pin array (FPA) packages. These types of electrical circuitry packages often employ electrically conductive flat wire terminals, also referred to as leads or pins, that typically are either clipped to the side of a substrate, surface mounted to the substrate, or soldered through plated vias. Flat terminals are generally inexpensive and are widely used in the electronics industry due to the relative ease of use in many applications.

The flat terminals generally have a difference in accumulative cross-sectional modulus of the terminals in the X and Y-axes, when the terminal is oriented in the Z-axis, due to the orientation of the flat terminals with respect to the substrate. This is particularly evident with wider and heavier terminals capable of handling high currents. As a consequence, the DIP, SIP, and FPA package and electrical connections at the terminals exhibit high bending resistance in the axis aligned with the flat side of the terminal, and much lower bending resistance in the axis normal to the flat side of the terminal. This difference in modulus can produce different amplitudes of motion in each axis when vibrations occur which can further result in accumulative fatigue in the terminals and connecting solder joints due to the greater terminal bending along the weaker modulus direction.

Additionally, differences in the coefficient of thermal expansion (CTE) of circuit boards can create differences in axial aligned modulus which can produce greater tendency to break terminal-to-pad solder joints due to stress risers aligned in the plane of higher cross-sectional modulus. When subjected to stress and vibration, the electrical circuitry packages are generally susceptible to electrical contact weakening and possible failure. As a consequence, conventional electrical circuitry packages typically require secondary support structures. Other approaches to interconnecting electrical circuits in such packages may include the use of round or square cross-sectional pins (terminals). However, round and square cross-sectional pins are generally more expensive, require additional conductive material, and, such pins must be attached to press on solder clips that allow the terminals to be attached to the substrate, which adds to the manufacturing costs.

It is therefore desirable to provide for an enhanced low cost electrical connection between first and second circuit elements using flat terminals which offers improved response to vibration stimulus, reduced solder pad stresses, and minimize the need for secondary support structures.

SUMMARY OF THE INVENTION

In accordance with the teachings of the present invention, an electrical terminal is provided for connecting a first circuit element to a second circuit element. The terminal includes a flat conductive member having a first end for connecting to a first circuit element and a second end for connecting to a second circuit element. The conductive member has a twisted section between the first and second ends that is axially twisted through an angle in the range of forty-five to one hundred thirty-five degrees (45°–135°).

According to another aspect of the present invention, a method of providing an electrical interconnection between first and second circuit element with a twisted flat terminal is provided. The method includes the steps of providing a first circuit element, providing a second circuit elements, and axially twisting a flat conductive terminal through an angle in the range of about forty-five to one hundred thirty-five degrees (45°–135°) about its longitudinal axis. The method further includes the steps of connecting a first end of the conductive terminal to the first circuit element, and connecting a second end of the conductive terminal to the second circuit element.

The electrical terminal and method of the present invention offers a low cost electrical connection that improves overall stress/fatigue performance. By twisting the flat terminal, the electrical interconnection improves response to vibration stimulus, reduces the solder pad stresses for electrical connections, and minimizes the need for secondary support structures.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
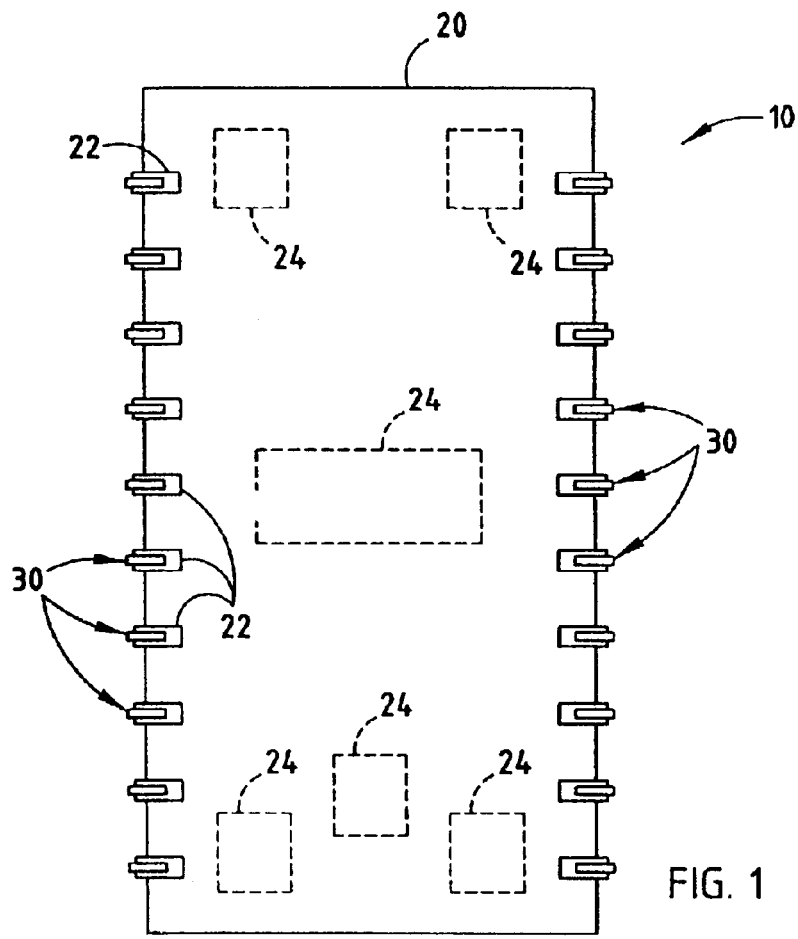
FIG. 1 is a top view of one example of a dual in-line package (DIP) employing flat electrical terminals to interconnect two circuit boards.
Figure 2:
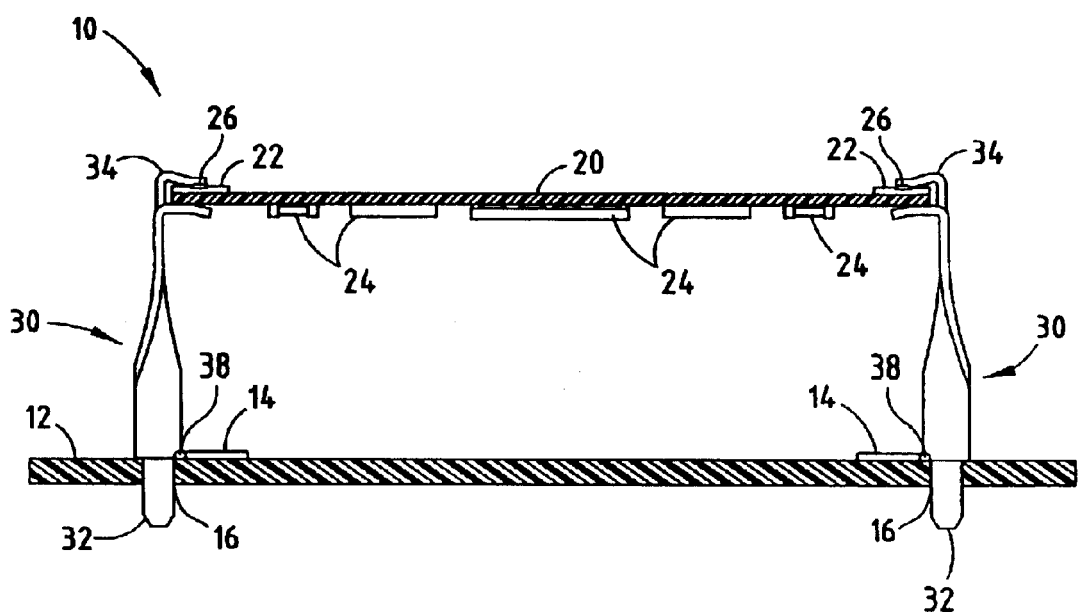
FIG. 2 is a detailed, partial sectional view of the DIP in FIG. 1 showing two twisted flat terminals according to the present invention.

Referring to FIGS. 1 and 2, a dual in-line package 10 is generally shown having a first circuit board 12 electrically and mechanically connected to a second circuit board 20 via a plurality of electrical terminals 30. According to one embodiment, first circuit board 12 may include a mother board, such as an engine control unit (ECU) for use in a vehicle, while second circuit board 20 may include a daughter board, such as an oxygen sensor driver or a fuel injector driver. The first and second circuit boards 12 and 20, respectively, each include electrical circuitry formed on a substrate. The first and second circuit boards 12 and 20 are electrically and mechanically connected via a plurality of twisted flat electrical terminals 30. Each of the plurality of electrical terminals 30 interconnects a circuit element of the first circuitry 14 formed on the first circuit board 12 with a circuit element of the second circuitry 22 formed on the second circuit board 20 to complete an electrical signal path. Additionally, twisted flat terminal 30 provide mechanical support and stability to support the arrangement of the first and second circuit boards 12 and 20.

The dual in-line package 10 may include any of a number of a plurality of twisted flat terminals 30 generally positioned at locations to provide electrical interconnections between any number of electrical circuits. It should be appreciated that the first circuit board 12 includes a plurality of circuit elements, generally depicted by circuitry 14. Likewise, it should be appreciated that the second circuit board 20 includes a plurality of circuit elements, generally depicted by circuitry 22. Mounted below second circuit board 20 are a plurality of surface mounted electrical devices 24, as should be evident to those skilled in the art. It should also be appreciated that various electrical devices may be mounted to first circuit board 12.

Figure 3:
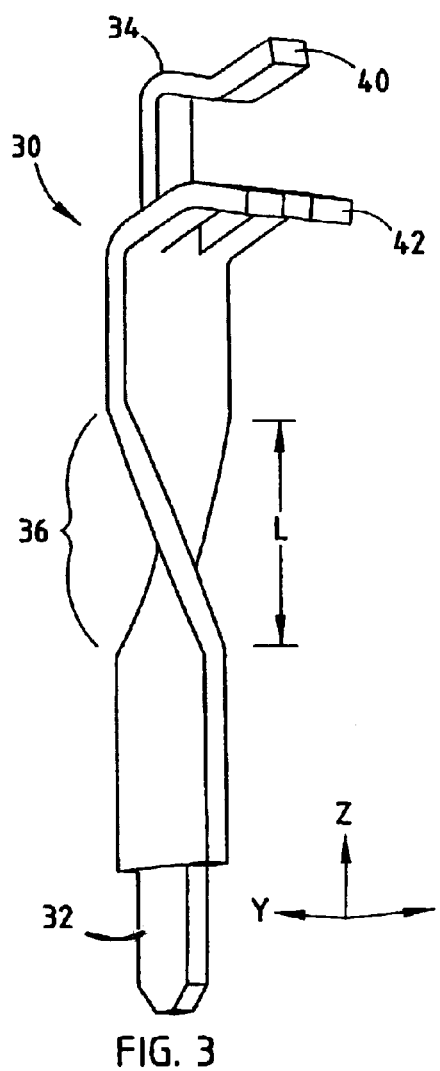
FIG. 3 is an enlarged perspective view of the twisted flat terminal according to the present invention.

Referring to FIG. 3, a single twisted flat terminal 30 is illustrated having a plug-in connector 32 formed at one end (lower end) and a clip-on connector 34 formed at the other end (upper end). The plug-in connector 32 has a reduced width male member configured to engage a female receptacle 16 in first circuit board 12. The clip-on connector 34 includes upper and lower prongs 40 and 42, respectively, for clipping on upper and lower surfaces of the second circuit board 20 so as to support the second circuit board 20 and make electrical contact with an electrically conductive element of circuit 22. The clipon connector 34 is soldered to circuit 22 via solder 26 as shown in FIG. 2. Likewise, the plug-in connector 32 is shown soldered to circuit 14 via solder 38. While a plug-in connector 32 and clip-on connector 34 are shown and described herein, it should be appreciated that other electrical connections may be formed at the ends of the twisted flat terminal 30 without departing from the teachings of the present invention.

Extending between the first and second ends of twisted flat terminal 30 is a flat conductive member having a twisted section 36 in which the flat conductive member is axially twisted about its longitudinal axis (Z-axis). The conductive member is twisted about the Z-axis through a plane defined by the X-axis and Y-axis. The twisted section 36 has a length L. Generally, the longer the length L of twisted section 36, the more stress/strain relief that will be achieved at the solder joints 26 and 38. The overall stiffness of the flat twisted terminal 30 in a plane defined by the X-axis and Y-axis can be adjusted by adjusting the length L of twisted section 36.

Figure 4:
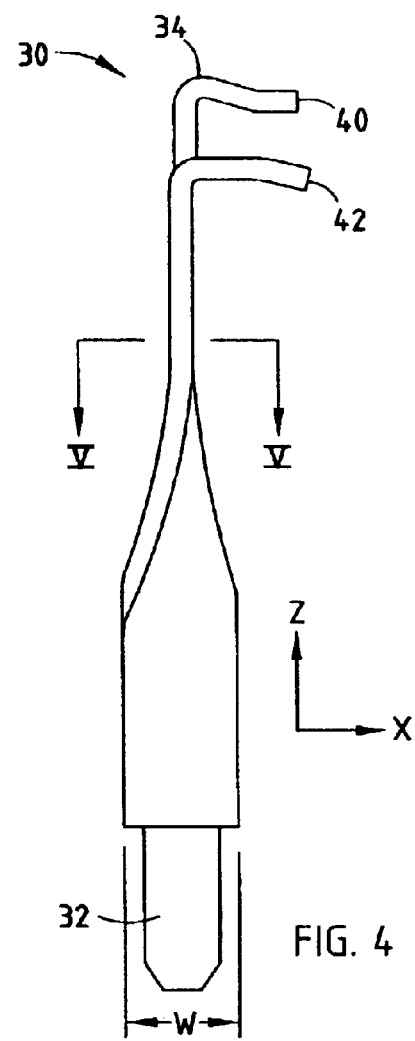
FIG. 4 is an enlarged front view of the twisted flat terminal.
Figure 5:
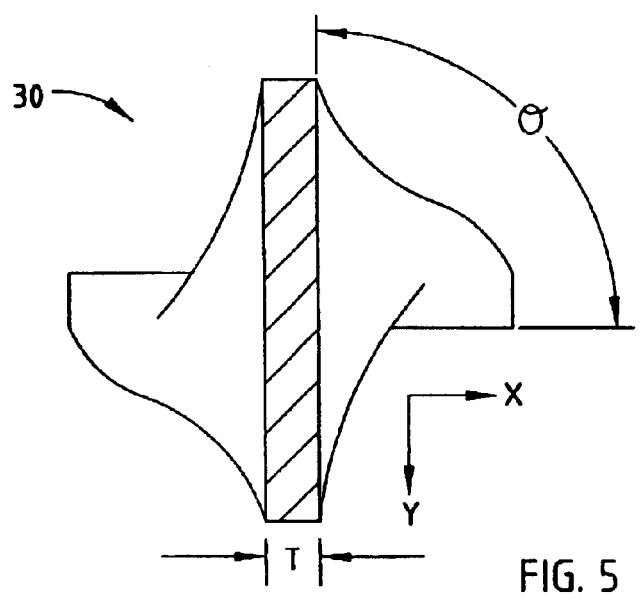
FIG. 5 is a cross-sectional view taken through lines V—V in FIG. 4.

Referring to FIG. 4, the flat twisted terminal 30 has a width W. The length L of the twisted section 36 is at least twice the width W of the flat twisted terminal 30. The twisted flat terminal 30 further includes a thickness T, as shown in FIG. 5. The twisted flat terminal 30 is formed from a conductive member having a front and back flat surface with a width W at least twice the thickness T. It should be appreciated that the type of conductive material, length of the terminal, length L of the twisted section 36, and width W and thickness T of the twisted flat terminal 30 may vary depending upon the application, including the electrical current requirements and mechanical strength and vibration requirements of the terminal 30 and solder joints 26 and 38.

With particular reference to FIG. 5, the electrical terminal 30 is shown twisted through an angle θ. According to one embodiment, the twist angle θ is in the range of forty-five to one hundred thirty-five degrees (45°–135°). According to a more specific embodiment, the twist angle θ is within the range of eighty-five degrees to ninety-five degrees (85°–95°). According to one embodiment, twist angle θ is approximately ninety degrees (90°). By twisting the flat electrical terminal 30 about its axial length throughout twisted section 36 by twist angle θ, the twisted flat terminal 30 reduces the stiffness of the terminal 30 in the strongest direction, reduces maximum stresses, and thereby reduces the tendency to fatigue and break at the solder connections 38 and 26 between the ends 32 and 34 of terminal 30 and circuits 14 and 22 on circuit boards 12 and 20, respectively. Additionally, the twisted flat terminal 30 raises the vibration natural frequencies by increasing the stiffness of the terminal 30 in the weakest direction, thereby improving the ability to withstand vibrations. The twist in terminal 30 distributes the moment of inertia along the length of the terminal 30 which reduces resultant solder joint stress due to thermal X-Y-axes mismatch and uneven vibration harmonics in the axis of least compliance.

The terminal 30 can be formed to include the twisted section 36 by any of a number of approaches. According to one embodiment, the axial twist can be formed during the initial stamping of the flat conductive member forming the terminal 30. According to another embodiment, a secondary stamping operation can be employed to reform a flat conductive member to include the twist section 36. This may occur when the flat conductive member is located in a bandolier and/or during a lead attach operation that removes the conductive member from the carrier/bandolier. According to a further embodiment, the axial twist may be formed in the electrical terminal 30 following attachment of The terminal 30 and reflow to one of the circuit board substrates.

Accordingly, the twisted flat terminal 30 of the present invention advantageously provides for a low cost electrical interconnection for connecting first and second circuit elements 14 and 22, particularly located on first and second circuit boards 12 and 20. The twisted flat terminal 30 improves the overall stress/fatigue performance of the terminal, improves response to vibration stimulus, lowers the solder pad stresses, and minimizes the need for secondary support structures to support the first and second circuit boards 12 and 20 in a package. While the twisted flat terminal 30 is shown in connection with the dual in-line package, it should be appreciated that the twisted flat terminal 30 may be used to provide a connection between first and second circuit elements in various packages including, but not limited to, a single inline line package, a flat pin array package, and other electrical packages that may employ flat terminals.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. A conductive terminal for connecting a first circuit element to a second circuit element, said terminal comprising a flat conductive member having a first end for connecting to the first circuit element and the second end for connecting to a second circuit element, wherein the flat conductive member has a width at least twice a thickness and a twisted section between the first and second ends that is axially twisted through an angle in the range of 45 to 135 degrees.

2. The terminal as defined in claim 1, wherein the conductive member is axially twisted through an angle within a range of about 85 to 95 degrees.

3. The terminal as defined in claim 2, wherein the conductive member is axially twisted through an angle of approximately 90 degrees.

4. The terminal as defined in claim 1, wherein the twisted section has a length, wherein the length of the twisted section is at least twice the width of the conductive member.

5. The terminal as defined in claim 1, wherein the first end of the conductive member is soldered to the first circuit element, and the second end of the conductive member is soldered to the second circuit element.

6. The terminal as defined in claim 1, wherein the first circuit element is provided on a first circuit board, and the second circuit element is provided on a second circuit board.

7. An electrical circuit comprising:

a first circuit element;

a second circuit element; and a conductive terminal comprising a flat conductive member having a first end electrically connected to the first circuit element and a second end electrically connected to the second circuit element, wherein the flat conductive member has a width at least twice a thickness and a twisted section between the first and second ends that is axially twisted through an angle in the range of 45 to 135 degrees.

8. The electrical circuit as defined in claim 7, wherein the first circuit element is provided on a first substrate and the second circuit element is provided on a second substrate.

9. The electrical circuit as defined in claim 8, wherein the first substrate comprises a first circuit board, and the second substrate comprises a second circuit board.

10. The electrical circuit as d defined in claim 7, wherein the twisted section has a length, wherein the length of the twisted section is at least twice the width of the conductive member.

11. The electrical circuit as defined in claim 7, wherein the conductive member is axially twisted through an angle in the range of about 85 to 95 degrees.

12. The electrical circuit as defined in claim 11 wherein the conductive member is axially twisted through an angle of approximately 90 degrees.

13. The electrical circuit as defined in claim 7, wherein the first end of the conductive member is soldered to the first circuit element, and the second end of the conductive member is soldered to the second circuit element.

14. A method of providing an electrical connection between first and second circuit elements, said method comprising the steps of:

providing, the first circuit element;

providing, the second circuit element;

providing a flat conductive terminal having a width at least twice a thickness;

twisting the flat conductive terminal through an angle in the range of about 45 to 135 degrees about its longitudinal axis;

connecting a first end of the conductive terminal to the first circuit element; and connecting a second end of the conductive terminal to the second circuit element.

15. The method as defined in claim 14, wherein the step of twisting the flat conductive terminal comprises twisting the terminal within a twisted section located between the first end and second end of the terminal.

16. The method as defined in claim 14, wherein the step of twisting the flat conductive terminal comprises twisting the flat conductive terminal through an angle in the range of 85 to 95 degrees.

17. The method as defined in claim 16, wherein the step of twisting the flat conductive terminal comprises twisting the flat conductive terminal through an angle of approximately 90 degrees.

18. The method as defined in claim 14, wherein the step of twisting the conductive terminal comprises twisting the conductive terminal within a twist section having a length, wherein the length of the twisted section is at least twice the width of the conductive terminal.

19. The method as defined in claim 14 further comprising the step of soldering the first end of the conductive terminal to the first circuit element, and soldering the second end of the conductive terminal to the second circuit element.

20. The method as defined in claim 14, wherein the steps of providing the first and second circuit elements comprise providing a first circuit board containing the first circuit element and providing a second circuit board containing the second circuit element.

* * * * *